US006830631B2

(12) United States Patent
Nenyei et al.

(10) Patent No.: US 6,830,631 B2
(45) Date of Patent: Dec. 14, 2004

(54) METHOD FOR THE REMOVING OF ADSORBED MOLECULES FROM A CHAMBER

(75) Inventors: Zsolt Nenyei, Wippingen (DE); Wilfried Lerch, Dornstadt (DE); Jürgen Niess, Sontheim (DE); Thomas Graf, Biberach (DE)

(73) Assignee: Steag RTP Systems GmbH (DE)

( * ) Notice: Subject to any disclaimer, the term of this patent is extended or adjusted under 35 U.S.C. 154(b) by 0 days.

(21) Appl. No.: 10/220,001

(22) PCT Filed: Feb. 21, 2002

(86) PCT No.: PCT/EP01/01931
§ 371 (c)(1),
(2), (4) Date: Sep. 25, 2002

(87) PCT Pub. No.: WO01/63002
PCT Pub. Date: Aug. 30, 2001

(65) Prior Publication Data
US 2003/0155000 A1 Aug. 21, 2003

(30) Foreign Application Priority Data
Feb. 25, 2000 (DE) .................................... 100 08 829

(51) Int. Cl.⁷ ................................................ B08B 7/04
(52) U.S. Cl. ........................ 134/37; 134/19; 134/21; 134/21.1; 134/22.15; 134/22.18; 134/30; 134/34; 134/902; 438/905; 438/906

(58) Field of Search .......................... 134/19, 21, 21.1, 134/22.15, 22.18, 30, 34, 902, 37, 17, 22.1, 31, 36; 438/905, 906; 34/402–406, 408–415, 212, 472, 443

(56) References Cited

U.S. PATENT DOCUMENTS

| 3,279,946 A | 10/1966 | Schaarschmidt |
| 4,512,812 A | 4/1985 | Liebert et al. |
| 4,723,363 A | 2/1988 | Seelbach et al. |
| 6,395,099 B1 * | 5/2002 | Pan .............................. 134/19 |
| 6,759,336 B1 * | 7/2004 | Chebi et al. ................. 438/694 |

FOREIGN PATENT DOCUMENTS

| JP | 61-208424 | * 9/1986 |
| JP | 405326477 A | * 12/1993 |

OTHER PUBLICATIONS

8257A Journal of Vacuum Science & Technology A 11 (1993) Jul./Aug. No. 4 Part 2 Woodbury, NY.

* cited by examiner

Primary Examiner—M. Kornakov
(74) Attorney, Agent, or Firm—Robert W. Becker & Asscoiates; Robert W. Becker

(57) ABSTRACT

A method of removing first molecules adsorbed on the surfaces of a chamber and/or at least one object found in the chamber is provided. Second, polar molecules that have a desorptive effect on the first molecules are introduced into the chamber. The second molecules comprise nitrogen and hydrogen, and especially $NH_3$ molecules.

18 Claims, 4 Drawing Sheets

METHOD FOR THE REMOVING OF ADSORBED MOLECULES FROM A CHAMBER

This application is a 371 PCT/EP01/01931 filed Feb. 21, 2002.

BACKGROUND OF THE INVENTION

The present invention relates to a method for the removal of first molecules that are adsorbed upon the surfaces of a chamber and/or of at least one object located in the chamber, in particular to the removal of polar molecules from a processing or transfer chamber of a rapid heating unit.

With many methods carried out within a processing chamber, such as, for example, CVD processes or thermal treatments of objects, especially in the semiconductor industry and microelectronics, moisture can, for example, adversely affect the process. Moisture tends to become adsorbed on the chamber walls, the objects, such as, for example, semiconductor substrates, or other elements in the chamber. Examples of processes that are adversely affected by the presence of water are the production of ultra shallow pn-junctions (ultra shallow junctions), metalizing or coating processes, and many CVD processes. In addition, water adversely affects so-called COP's or crystal originated particles, as well as the formation of oxygen-free surface layers (magic denuded zones).

The water molecules adsorbed on the chamber walls or on the substrates lead to undesired chemical reactions that adversely affect a treatment result. Primarily during the thermal treatment of semiconductor substrates, water negatively acts within the reaction chamber upon the substrates that are to be treated or upon the layers applied thereon. For example, water in the order of magnitude of less than 1 ppm to several 100 ppm in an oxygen-free atmosphere has an etching effect, as a function of the process temperature, upon silicon or GaAs wafers during a thermal treatment. An originally smoothly polished surface of the wafer is thereby atomically roughened. It is possible for zones of a diffused haze to form upon the wafer. Structures provided on the substrate surface can be destroyed or at least adversely affected thereby. Furthermore, the material of the semiconductor wafer that has been etched away could be deposited at some other location within the processing chamber, thereby contaminating the chamber.

The cause for water within a processing chamber is primarily the humidity of the atmospheric air. With every opening of the processing chamber, for example for the removal and introduction of the object that is to be treated or during maintenance work, air enters the processing chamber. In clean rooms, the relative humidity is generally between 38% and 42%. The water present in the air is deposited upon the object to be treated or the inner chamber walls. This problem occurs particularly intensely after a previously effected wet chemical treatment of the object. In such cases, water is adsorbed in substantially greater quantities by the substrate surface However, also special coatings of a wafer with various materials, as frequently occurs in the semiconductor industry, can increase the adsorption effect relative to water. Silicon dioxide, which is frequently used as a coating material, is extremely hydrophilic and has a large adsorption effect relative to water. In particular during CVD processes, the processing chamber can become contaminated by pulverous deposits. In these cases, a large quantity of water can be absorbed, since as a consequence of the pulverous micro particles in the chamber, an increased surface results for the adsorption.

To remove water from a processing chamber, it is known to rinse the chamber with an inert gas over a long period of time. In this connection, rinsing times of up to 12 hours are not at all uncommon in order to reduce the water content within the processing chamber to an acceptable level, as is described, for example, by Andrew, Inman, Haider, Gillespie & Brookshire in "Increasing equipment uptime through in situ moisture monitoring", Solid State Technology, August 1998. With systems where the substrate is introduced into the chamber via a transfer mechanism, so-called load-lock-systems, it is not necessary to rinse the entire chamber, but rather merely the smaller transfer chamber in which the wafer is located prior to the loading. Although the rinsing time is thereby reduced to 4 hours, it is still extremely long, as a result of which the treatment of semiconductor wafers becomes uneconomical.

Proceeding from this known method, it is therefore an object of the present invention to provide a method for the rapid and efficient removal of polar molecules, such as, for example, water molecules, but also non-polar molecules, such as, for example, oxygen molecules, from a chamber. In this connection, the present invention is related in particular to the removal of water molecules from a processing and/or transfer chamber of a rapid heating unit.

SUMMARY OF THE INVENTIONS

Pursuant to the present invention, the object is realized by introducing second polar molecules into the chamber that exert a desorptive effect upon the first molecules. The introduction of the second polar molecules accelerates the desorption of the undesired first molecules. After detaching the first molecules, the second polar molecules preferably assume the location of the first molecules, thus preventing a renewed adsorption. As a consequence, more rapidly prescribed threshold values can be achieved for the concentration of the first molecules within the chamber, as a result of which the throughput rates of the unit, and hence its economy, can be increased. At the same time, lower values of the concentration of the first molecules can be achieved within the chamber, which leads to improved process results. The first molecules are preferably water and/or oxygen molecules that can have an etching effect upon the semiconductor wafer. By removing these molecules, damage to the wafers or the structures provided thereon can therefore be prevented. Pursuant to one preferred embodiment of the invention, prior to, during and/or after the introduction of the second polar molecules, a rinsing gas, especially an inert gas or $N_2$, is conveyed through the chamber in order to reliably take the desorbed first molecules out of the chamber. In this connection, according to one embodiment of the invention initially rinsing gas and subsequently a mixture of rinsing gas and the second polar molecules are preferably conveyed through the chamber in order to initially achieve a preliminary rinsing. Only after the preliminary rinsing are the second polar molecules conveyed through the chamber in order to effect a further desorption of the first molecules. As a result of this two-stage step, the quantity of the second polar molecules utilized can be reduced. In order to take, for example, water away at a relative humidity of about 40% and at room temperature by means of $NH_3$, a mixture ratio of 9:1 between the rinsing gas and the polar $NH_3$ has been shown to be advantageous.

Pursuant to an alternative embodiment, first the rinsing gas and subsequently the second polar molecules are conveyed through the chamber in order to again achieve a two-stage process. Due to the fact that in the second stage only polar molecules are conveyed through the chamber, the desorptive effect is significantly increased. After the second step, a rinsing gas can again be advantageously conveyed through the chamber.

To promote the desorption of the first molecules, the temperature within the chamber is preferably controlled. In this connection, the walls of the chamber and/or an object found in the chamber, such as, for example, a semiconductor wafer, are preferably heated. For a good desorption effect, the object is preferably heated to a temperature range between 400° C. and 800° C.

The desorption can advantageously also be enhanced by heating the second polar molecules and/or the rinsing gas prior to the introduction into the chamber.

Pursuant to one preferred embodiment of the invention, the second polar molecules comprise nitrogen and hydrogen, and form in particular $NH_3$ molecules. In an alternative embodiment of the invention, the second polar molecules comprise fluorine and/or chlorine. When selecting the exchange adsorbent, one must pay attention that the second polar molecules support the desired rapid heating process and are in no way disruptive. Thus, for example, an undesired oxidizing effect of water is avoided if one selects $NH_3$ as the second polar molecule and thus a frequently desired nitridation or a reducing effect upon the object to be processed is brought about. Depending upon the process, the second polar molecules can be $NH_3$, $O_3$, $NO_2$, NO, $PH_3$, $SiH_4Cl_2$ or weakly polar molecules such as $TiCl_4$ or $SiH_4$, whereby in connection with their chemical compatibility, mixtures of these gases could also be utilized. The pressure in the chamber is advantageously controlled to an overpressure or an underpressure. A sequential desorption in multiple rinsing stages can also be advantageous, whereby in each stage different polar molecules or molecule mixtures are utilized.

The present disclosure is particularly suitable for the removal of water and oxygen molecules from the processing and/or transfer chamber of a rapid heating unit for the thermal treatment of semiconductor wafers.

BRIEF DESCRIPTION OF THE DRAWINGS

The invention will be explained in greater detail subsequently with the aid of preferred embodiments in conjunction with the Figures. The Figures show.

DESCRIPTION OF PREFERRED EMBODIMENTS

Figure 1:
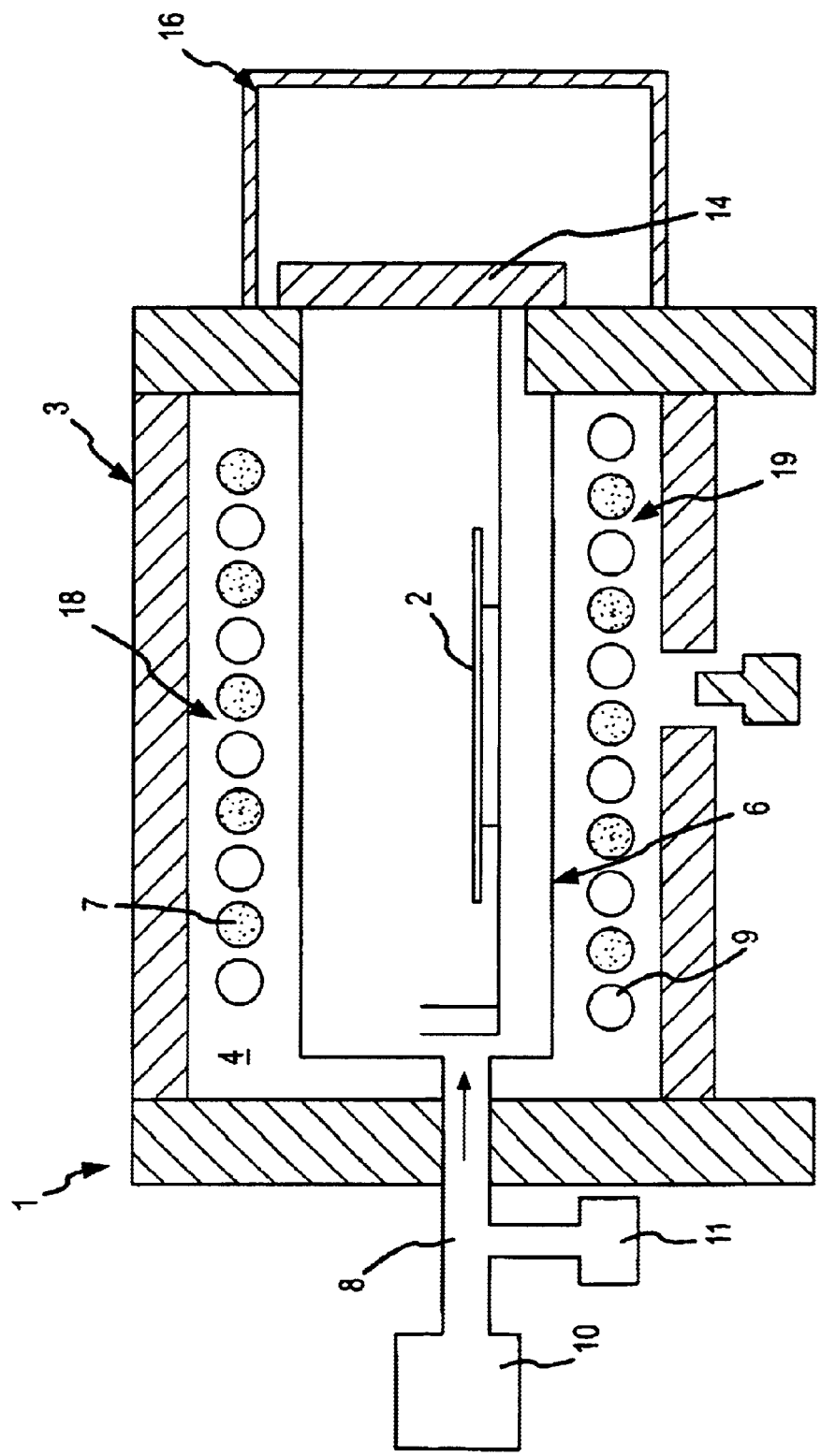
FIG. 1 a schematic cross-sectional view of an apparatus for the thermal treatment of a substrate.

FIG. 1 shows a schematic illustration of a rapid heating unit 1 for the thermal treatment of substrates 2, as known, for example, from the not-prepublished DE 199 23 400.0 of this same applicant. The apparatus 1 has a housing 3, which in the interior can include a reflective chamber 4. Provided within the housing 3 is a processing chamber 6 that is made, for example, of quartz. Within the processing chamber 6 a support is provided for accommodating and holding a semiconductor wafer 2. The processing chamber 6 is provided at one end with a gas inlet line 8 that is in communication with at least two different sources of gas 10 and 11. An end of the processing chamber 6 opposite the gas line 8 is closed off by a chamber door 14. In the region of the chamber door 14, a transfer chamber 16 can be provided on the outer side of the housing 3 via which, in a known manner, semiconductor wafers 2 are introduced into the processing chamber 6 and are removed therefrom.

The processing chamber 6 is spaced from an upper and a lower wall of the housing 3, and disposed in the spaces formed therebetween are banks of lamps 18, 19 in order to be able to thermally treat these semiconductors wafers 2 in a known manner. In this connection, the banks of lamps 18, 19 can be provided not only with tungsten-halogen lamps 7 as well as UV lamps 9, or can be respectively provided with only one type of lamp.

During the opening of the transfer chamber 16, air having a certain moisture content enters the transfer chamber 16, which air, upon opening of the chamber door 14, passes at least partially into the processing chamber 6. The moisture contained in the air can be adsorbed upon the inner walls of the processing chamber 6, the holding elements located in the chamber 6, and upon the semiconductor wafers 2. However, it is important to reduce the moisture in the chamber to a minimum, since the moisture can damage the semiconductor wafers 2 during a thermal treatment thereof. Thus, international development guidelines, such as the Sematech Roadmap, or the International Roadmap for Semiconductors (ITRS), in conjunction with the 0.13 $\mu$m technology, call for an overall content of oxidizing substances, i.e. $O_2$ and $H_2O$, of less than 1 ppm within the chamber.

In order to reduce the moisture content to such an extent, a rinsing gas, such as, for example, an inert gas or $N_2$, is introduced into the processing chamber 6 via the line 8 from the gas source 10, and is discharged at a suitable, non-illustrated location. The rinsing gas takes up a portion of the moisture and transports it out of the processing chamber 6. To achieve a desorption of adsorbed $O_2$ and $H_2O$ molecules, in addition a gas, such as, for example, $NH_3$, that contains polar molecules is introduced into the line 8 and the processing chamber 6 from the gas source 11. The polar molecules have a desorptive effect upon water and oxygen, and thus enable a better removal of the water and the oxygen from the chamber 6. In this connection, the gas of polar molecules can be introduced into the rinsing gas stream, or the rinsing gas stream can be interrupted and only polar gas can be introduced into the chamber 6 in order to provide a good desorptive effect. Subsequently, a rinsing gas can again be introduced into the chamber 6, or a process gas can be introduced that promotes certain reactions during the thermal treatment of the semiconductor wafer 2. These steps can be repeated as often as desired, whereby in each step other gases can be utilized. The desorptive effect can also be achieved by a gas mixture of various polar molecules, the concentration of which can be adapted to the process conditions, such as, for example, temperature and pressure. Furthermore, the polar molecules that act in a desorptive manner can also first be generated in the reaction chamber. For example, ozone can be produced via UV radiation in an oxygen-containing process gas atmosphere.

Suitable as polar gases that exert a desorptive effect upon water are, for example, nitrogen-hydrogen compounds, such as ammonia $NH_3$ or hydrazine $N_2H_4$, hydrogen-halogen compounds such as HCl, nitrogen-halogen compounds such as $NF_3$, and halogenated hydrocarbons such as $CH_3F$ or $CHCl_3$ (chloroform) etc., to name just a few examples.

Pursuant to the adsorption theory (adsorption isotherms from Langmuir), an increase of the partial pressure of the gases utilized is advantageous. Particularly advantageous is an overpressure of the polar gas.

For certain rapid heating processes, the use of $NH_3$ advantageously permits the reduction of the process temperature, and hence the thermal stressing of the substrate, since $NH_3$ is dissociated in various ways and reactive hydrogen is released.

For the inventive method it is not necessary to rinse the processing chamber in stages or continuously with a polar gas. In certain applications, a periodic rinsing process for the removal of the water is advantageous, whereby a rinsing or process gas, and a polar gas, alternate in the gas stream after prescribed modulation. To enhance the desorption of water, the temperature of the processing chamber 6 and/or of the wafer 2 can be varied during the individual rinsing processes.

Figure 2A:
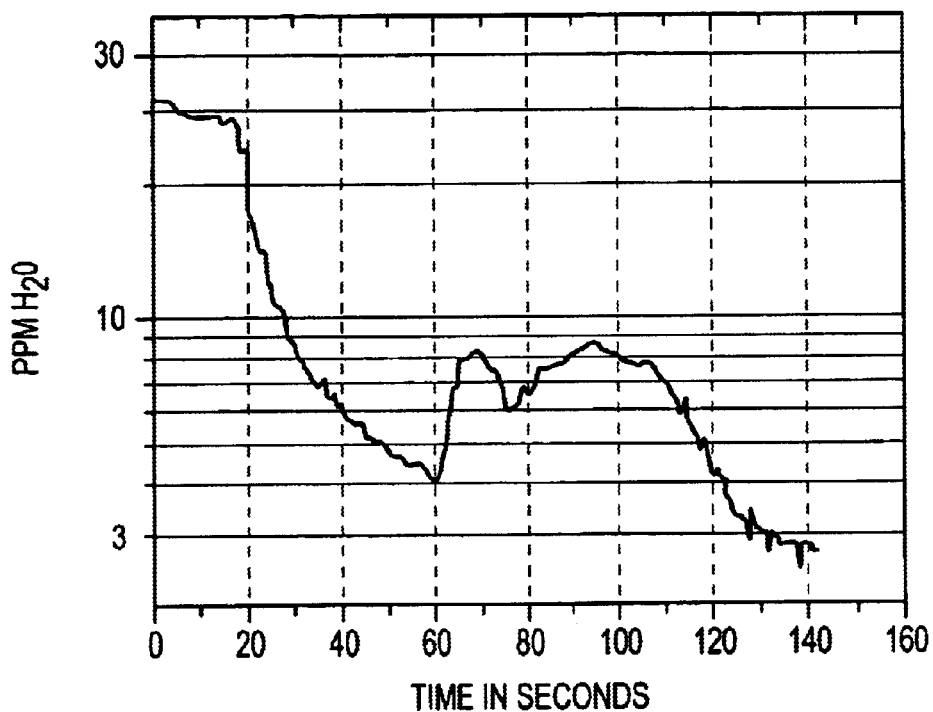
FIG. 2a the water content in a gas stream upon leaving a processing chamber as a function of time.
Figure 2B:
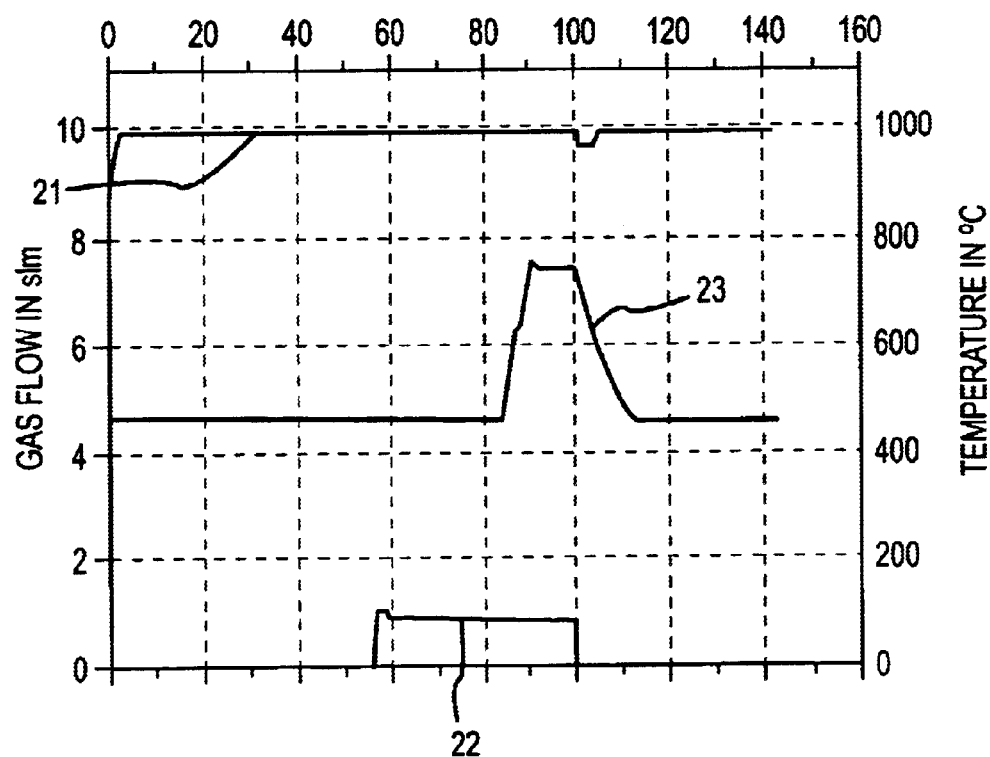
FIG. 2b a graph of a gas flow curve, as well as of a temperature curve, within a processing chamber as a function of time.

FIG. 2 shows the results of a test that shows the influence of a polar gas upon the moisture concentration within a processing chamber of a rapid heating unit. The test was carried out on a rapid heating unit of the type AST 2800E of the company STEAG RTP Systems GmbH. An upper graph shows the content of water molecules in a gas stream discharging from a processing chamber in ppm, i.e. in parts per million. In the graph shown in FIG. 2b, a first curve 21 shows an argon flow through the processing chamber of the rapid heating unit; a second curve 22 shows an ammonia ($NH_3$) flow through the processing chamber, and a third curve 23 shows the temperature of a semiconductor wafer located in the chamber, with the temperature being measured by a pyrometer in a known manner.

As one can recognize from the two graphs, in the first 60 seconds after the start of an argon flow of about 10 slm, the water content in the gas stream discharging out of the processing chamber continuously drops to 4 ppm. The reason for this is that the argon stream draws water molecules along to the outside out of the chamber, and the water content in the chamber drops over time.

Approximately 55 seconds after the initiation of the argon stream, an additional stream of 1 slm ammonia is introduced into the chamber, as can be seen in FIG. 2b. Shortly thereafter, the water fraction increases in the gas stream discharging from the chamber to 8 ppm, which is attributable to the fact that the ammonia molecules exert a desorptive effect upon the water molecules. Furthermore, the ammonia particles assume the sites of the water molecules on the various surfaces, such as the chamber walls and/or the wafer surfaces, as a result of which a renewed adsorption of the water molecules is prevented. As a consequence of the statistical distribution of thermal energy upon the individual molecules a certain fraction of the water molecules continuously receive enough energy to overcome the adsorption energy and to be released from the surfaces and thereby free up adsorption sites. These freed sites are occupied by the ammonia molecules. The desorbed water molecules are picked up by the gas stream of argon and ammonia, and are conveyed out of the chamber, as a result of which the water percentage rises in the gas stream, as can be seen in FIG. 2a.

After the initial increase of the water content to approximately 8 ppm, at about 70 seconds the water content again begins to drop. A renewed increase of the water content is achieved by heating the wafer to an increased temperature. As can be recognized in the curve 23 in FIG. 2b, the wafer temperature is heated to approximately 750° C. This heating enhances the desorption of water, which results in a renewed increase of the water content in the gas stream that is discharged from the processing chamber, as shown in FIG. 2a. The temperature of the wafer was measured with a pyrometer. Since a slightly doped silicon wafer is semitransparent below 450° C. in the infrared wavelength range, and a non-measurable weak thermal radiation is emitted, the temperature curve is commenced only after this temperature limit.

The wafer is preferably heated to a temperature of 750° C., and is held at this temperature for ten seconds, as can be seen in FIG. 2b. The wafer temperature is preferably in a range between 400° C. and 800° C. Ten seconds suffice in order to achieve a renewed maximum of the water content in the rinsing gas. As an alternative to heating the wafer, the argon and/or ammonia gas can also be heated in order to enhance the desorption of water.

After the heating lamps have been shut off, and the wafer has cooled, the water content in the gas stream also drops to a range below 3 ppm.

Figure 3A:
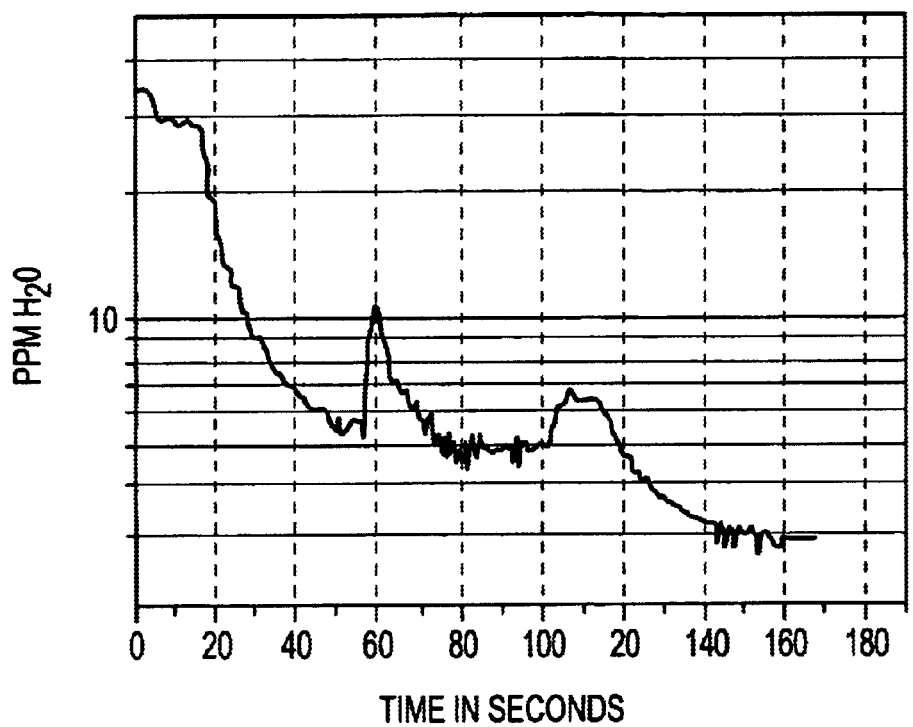
FIGS. 3a, 3b similar graphs as in 2a and 2b with different gas flows and temperature curves.
Figure 3B:
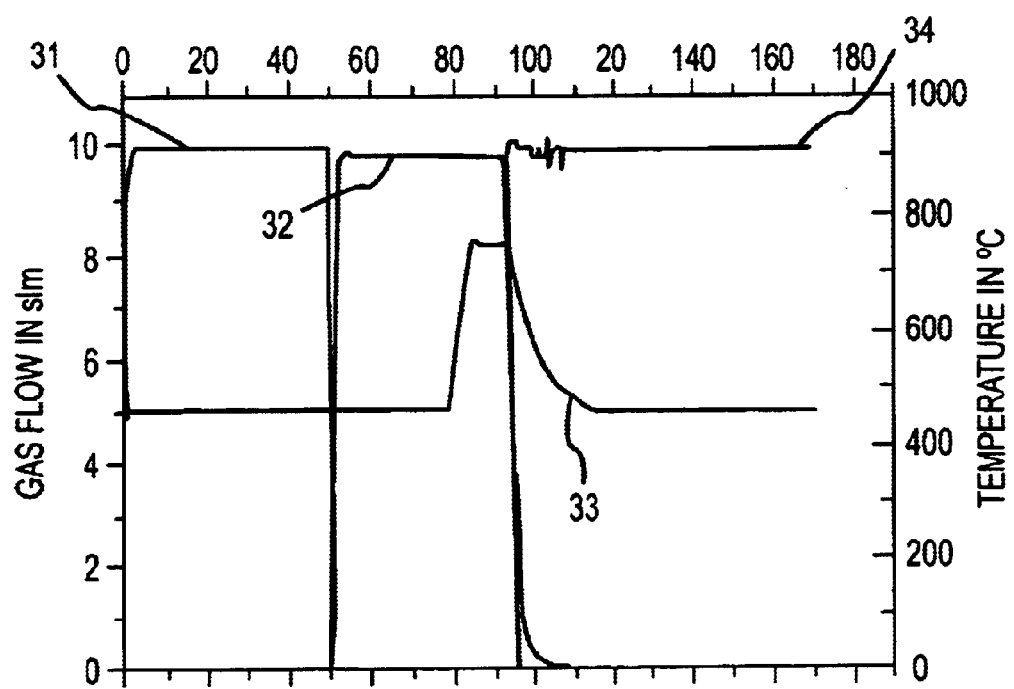

FIG. 3 shows the results of a further test with essentially the same test configuration as described previously. As before, the chamber is first prerinsed for about 50 seconds with an argon stream having approximately 10 slm (curve 31). The amount of water in the gas stream discharging from the processing chamber again drops continuously. Subsequently, the argon stream is replaced by a pure $NH_3$ stream of 10 slm (curve 32). Immediately upon initiation of the $NH_3$ stream, the water content in the gas stream discharging from the processing chamber rises to 10 ppm. With the previous test, the water fraction rose to only 8 ppm. Furthermore, the peak of the maximum is far more pronounced with this test. This points to a more efficient water desorption with a pure $NH_3$ stream in contrast to an argon-ammonia stream. Since the water sensor outside of the reaction chamber was connected to the gas flow system, the peaks in the curves for the $H_2O$ content occurred in part with 10–20 second lag.

As with the previous test pursuant to FIG. 2, a semiconductor wafer located in the chamber is heated up (curve 33) to enhance the water desorption. Again in this case a local maximum of the curve that indicates the water content in the gas stream is produced as a result of heating the wafer. At the end of the heating step, the $NH_3$ stream is again switched to Ar (curve 34).

The graphs of FIGS. 2 and 3 clearly show an improved removal of water from the processing chamber by introducing a polar gas, such as, for example, ammonia, into the processing chamber.

There is furthermore clearly shown that an increase in temperature also enhances the removal of water from a processing chamber.

Depending upon process conditions, it can be advantageous to rinse the chamber with a mixture of several polar gases instead of with a single polar gas.

Figure 4:
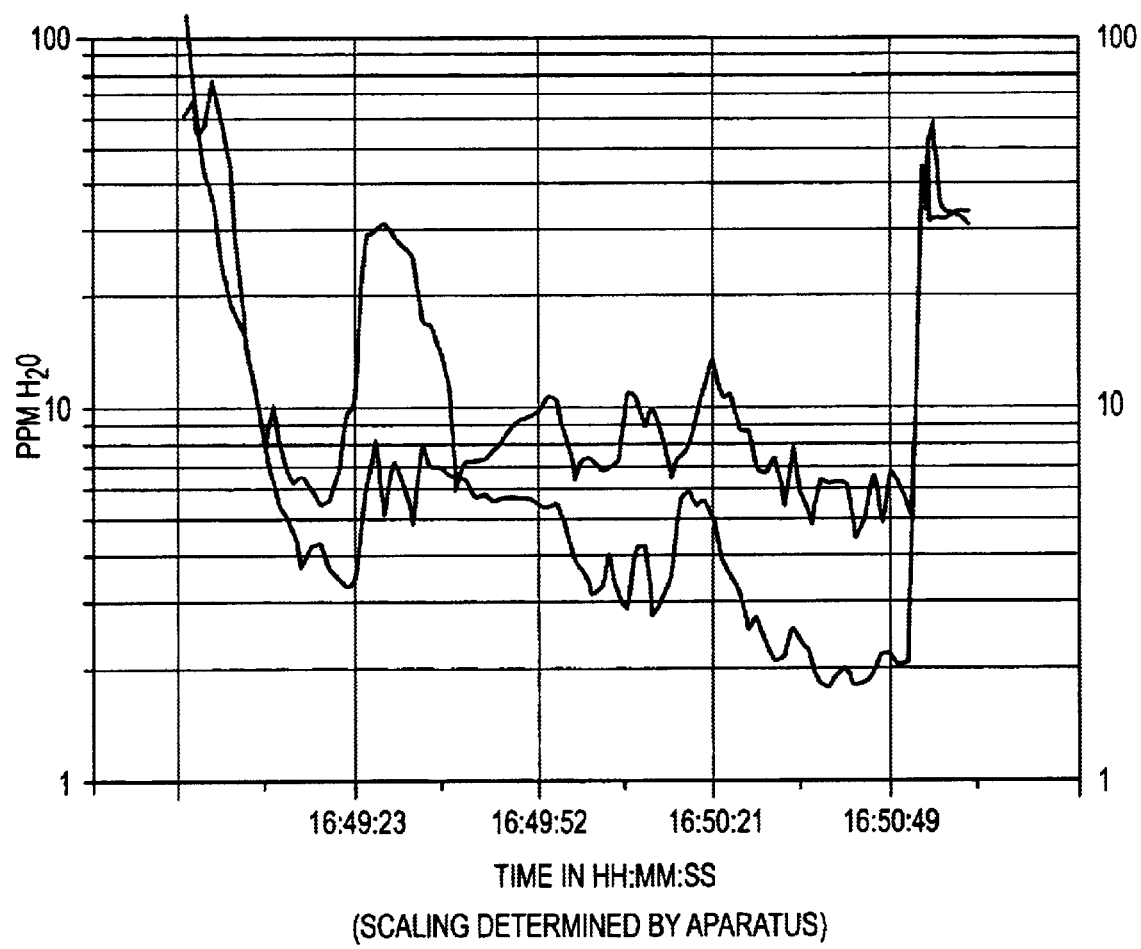
FIG. 4 a graph that shows the effects of multiple repetitions of the inventive method upon the moisture in a processing chamber.

FIG. 4 shows the effects of multiple repetition of the above-mentioned method upon the moisture content in the processing chamber. In the graph of FIG. 4, the water content in a gas stream discharging from the processing chamber is shown as a function of time. A gas stream and temperature control pursuant to FIG. 3b were used for the reduction of the moisture concentration in the chamber.

The curve 41 shows the progress of the water content in the gas stream discharging from the processing chamber for a first wafer, and the curve 42 shows the curve of the water content in the discharging gas stream during the treatment of the tenth wafer.

The time period $t_1$ indicates the point in time at which the ammonia stream is initiated during the treatment.

During the loading and removal of the wafers, an argon stream of 15 slm is maintained through the chamber in order to suppress an entry of atmospheric air into the processing chamber. The treatment processes were successively carried out for ten wafers. From a comparison of the curves 41 and 42 it can be clearly recognized that the curve 42, after the introduction of the ammonia stream at the point in time $t_1$, has a much lower local maximum than does the curve 41. From this one can conclude that the repeated carrying out of the inventive method results in a considerable reduction of the moisture content in the chamber.

Although the invention was described with the aid of a preferred embodiment, the inventive method can also be used with other apparatus. In particular, the described method is advantageous with units that are provided with a transfer system, for example if the processing chamber itself and other components of the unit are evacuated. In these cases, the described removal of adsorbed water can be carried out without or with the optional heating step in the transfer mechanism, before the wafer is introduced into a processing chamber. Due to the typically relatively small volume of a transfer chamber, a rapid desorption of water can be achieved. Of course, also in these situations a gas introduced into the transfer chamber can be heated up in order to enhance the desorption, of water and thus achieve a more rapid reduction of the moisture concentration within the transfer chamber.

The specification incorporates by reference the disclosure of German priority document 100 08 829.5 filed 25 Feb. 2000 and International priority document PCT/EP01/01931 filed 21 Feb. 2002.

The present invention is, of course, in no way restricted to the specific disclosure of the specification and drawings, but also encompasses any modifications within the scope of the appended claims.

What is claimed is:

1. A method of removing first molecules adsorbed on surfaces of at least one of a processing chamber and at least one object located in the chamber, said method including the step of:
   introducing into said chamber second polar molecules that have essentially only a desorptive effect on said first molecules, wherein said second molecules comprise nitrogen and hydrogen, and wherein said second molecules and/or said surfaces are provided with thermal energy sufficient to replace the first molecules with the second molecules on said surfaces.

2. A method according to claim 1, wherein said second molecules are $NH_3$ molecules.

3. A method according to claim 1, wherein said first molecules are oxygen molecules.

4. A method according to claim 1, wherein said first molecules are polar molecules.

5. A method according to claim 4, wherein said first molecules are water molecules.

6. A method according to claim 1, wherein a rinsing gas is conveyed through said chamber prior to, during, and/or after introducing said second, polar molecules into said chamber.

7. A method according to claim 6, wherein said rinsing gas is an inert gas.

8. A method according to claim 1, wherein first rinsing gas and subsequently a mixture of rinsing gas and said second, polar molecules are conveyed through said chamber.

9. A method according to claim 8, wherein the mixture ratio of said rinsing gas and said second, polar molecules is approximately 9 to 1.

10. A method according to claim 1, wherein first rinsing gas a subsequently said second, polar molecules are conveyed through said chamber.

11. A method according to claim 1, which includes the step of controlling a temperature within said chamber.

12. A method according to claim 1, wherein at least one of said walls of said chamber and an object located in said chamber are heated.

13. A method according to claim 1, wherein said object is heated to a temperature range between 400° C. and 800° C.

14. A method according to claim 6, wherein at least one of said second, polar molecules and said rinsing gas are heated prior to being introduced into said chamber.

15. A method according to claim 1, wherein said second, polar molecules further comprise at least one of fluorine and chlorine.

16. A method according to claim 1, which includes the step of controlling a pressure in said chamber to an overpressure or an underpressure.

17. A method according to claim 7, wherein said rinsing gas is $N_2$.

18. A method of removing first molecules adsorbed on surfaces of at least one of a processing chamber and at least one object located in the chamber, said method including the step of: introducing into said chamber second polar molecules that have a desorptive effect on said first molecules, wherein said first molecules are oxygen molecules and wherein said second molecules comprise nitrogen and hydrogen.

* * * * *

UNITED STATES PATENT AND TRADEMARK OFFICE
CERTIFICATE OF CORRECTION

PATENT NO. : 6,830,631 B2
DATED : December 14, 2004
INVENTOR(S) : Nenyei et al.

Page 1 of 1

It is certified that error appears in the above-identified patent and that said Letters Patent is hereby corrected as shown below:

<u>Title page,</u>
Item [54], Title, should read as follows:
-- [54] METHOD FOR THE REMOVAL OF ABSORBED MOLECULES FROM A CHAMBER --
and,
Item [22], should read as follows:
-- Item [22], PCT Filed: February 21, 2001 --

Signed and Sealed this

Third Day of May, 2005

JON W. DUDAS
*Director of the United States Patent and Trademark Office*